(12) United States Patent
Taffner et al.

(10) Patent No.: US 9,225,309 B2
(45) Date of Patent: Dec. 29, 2015

(54) AUDIO AMPLIFIER HAVING LOAD ADJUSTMENT AND METHOD FOR THE LOAD ADJUSTMENT OF THE AUDIO AMPLIFIER

(75) Inventors: Josef Taffner, Donaustauf (DE); Gregor Sauer, Butzbach-Griedel (DE); Christian Glueck, Eden Prairie, MN (US); Josef Plager, Bogen (DE); Peter Hallstein, Darmstadt (DE)

(73) Assignee: Robert Bosch GmbH, Stuttgart (DE)

( * ) Notice: Subject to any disclaimer, the term of this patent is extended or adjusted under 35 U.S.C. 154(b) by 742 days.

(21) Appl. No.: 13/062,083

(22) PCT Filed: Aug. 31, 2009

(86) PCT No.: PCT/EP2009/061201
§ 371 (c)(1),
(2), (4) Date: Mar. 3, 2011

(87) PCT Pub. No.: WO2010/034589
PCT Pub. Date: Apr. 1, 2010

(65) Prior Publication Data
US 2011/0158437 A1 Jun. 30, 2011

(30) Foreign Application Priority Data
Sep. 25, 2008 (DE) .......................... 10 2008 042 377

(51) Int. Cl.
*H03G 11/00* (2006.01)
*H03G 7/08* (2006.01)
(Continued)

(52) U.S. Cl.
CPC .. *H03G 7/08* (2013.01); *H03F 1/52* (2013.01); *H04R 3/007* (2013.01); *H04R 2420/05* (2013.01)

(58) Field of Classification Search
CPC ...... H04R 3/007; H04R 2420/05; H03F 1/52; H03F 2200/426; H03F 2200/429; H03F 2200/258; H03F 2203/21103; H03F 2203/21139; H03G 1/04; H03G 3/007; H03G 11/00; H03G 11/04; H03G 2201/208
USPC .......................................... 381/120, 55, 94.9
See application file for complete search history.

(56) References Cited

U.S. PATENT DOCUMENTS

| 4,721,923 A | 1/1988 | Bares et al. |
| 5,200,709 A | 4/1993 | Saito et al. |

(Continued)

FOREIGN PATENT DOCUMENTS

| EP | 0 590 903 | 4/1994 |
| EP | 0 762 633 | 3/1997 |

(Continued)

*Primary Examiner* — Duc Nguyen
*Assistant Examiner* — Kile Blair
(74) *Attorney, Agent, or Firm* — Michael J. Striker

(57) ABSTRACT

The invention relates to an audio amplifier (1) for amplifying an input signal into an output signal, comprising an output amplification stage (6), wherein the output amplification stage (6) for the amplification of an intermediate signal into the output signal is designed as an amplifier operating in switching operation, and further comprising a limiter device (4), which from a programming and/or a circuit design point of view is designed to generate the intermediate signal on the basis of the input signal, wherein the level of the intermediate signal is always limited by a maximum load as a function of a settable maximum output and a load impedance which is coupled and/or can be coupled the audio amplifier or equivalent parameter thresholds such that the output signal does not exceed the maximum load at the load impedance, or the equivalent parameter thresholds, independently of the input signal.

13 Claims, 2 Drawing Sheets

(51) Int. Cl.
*H04R 3/00* (2006.01)
*H03F 1/52* (2006.01)

(56) References Cited

U.S. PATENT DOCUMENTS

| | | | |
|---|---|---|---|
| 5,389,829 | A | 2/1995 | Milazzo |
| 5,506,532 | A | 4/1996 | Milazzo |
| 5,532,649 | A | 7/1996 | Sahyoun |
| 5,789,975 | A | 8/1998 | Yoshida et al. |
| 6,765,436 | B1 | 7/2004 | Melanson et al. |
| 6,853,242 | B2 | 2/2005 | Melanson et al. |
| 6,980,058 | B2 | 12/2005 | Noro |
| 2011/0158437 | A1 | 6/2011 | Taffner et al. |

FOREIGN PATENT DOCUMENTS

| | | |
|---|---|---|
| JP | 2-186812 | 7/1990 |
| JP | 3-192907 | 8/1991 |
| JP | 9-130160 | 5/1997 |
| JP | 2002-198756 | 7/2002 |
| JP | 2004-214793 | 7/2004 |
| JP | 2005-94144 | 4/2005 |
| JP | 2005-223717 | 8/2005 |
| JP | 2006-60545 | 3/2006 |
| WO | 2004/023631 | 3/2004 |

AUDIO AMPLIFIER HAVING LOAD ADJUSTMENT AND METHOD FOR THE LOAD ADJUSTMENT OF THE AUDIO AMPLIFIER

BACKGROUND INFORMATION

The invention relates to an audio amplifier for amplifying an input signal into an output signal using an output amplification stage, wherein the output amplification stage is designed as an amplifier that operates in the switched mode to amplify an intermediate signal into the output signal. The invention furthermore relates to a method for adjusting the load of the audio amplifier.

Audio amplifiers are used to amplify an input signal into an output signal, wherein the output signal is usually irradiated acoustically into the surroundings using loudspeakers. Audio amplifiers are known for use e.g. in home theater systems or acoustic irradiation systems for discotheques, movie theaters, etc., or for public buildings, schools, universities, etc., to disseminate announcements.

The number, load impedance, and electrical loadability of loudspeakers supplied with signals from typical audio amplifiers can vary in nearly any possible way. In order to provide every configuration with an audio amplifier that is appropriate in terms of total load impedance and the desired output power, it is typical to offer different audio amplifier models having discretely graduated output power on the market.

DISCLOSURE OF THE INVENTION

The invention discloses an audio amplifier having the features of claim 1, and a method having the features of claim 12. Preferred or advantageous embodiments of the invention result from the dependent claims, the description that follows, and the attached figures.

The audio amplifier according to the invention is suited and/or designed to amplify an input signal into an output signal. The audio amplifier can be used e.g. in music systems or, preferably, in public address systems, in particular in public address systems for use in complex regions. In particular, the audio amplifier is designed as a low ohmic, controlled voltage source. The output signal of the audio amplifier is preferably defined as the signal that is output to electromechanical acoustic signal transformers and/or loudspeakers. The input signal is preferably designed as an analog signal that originates at a microphone or another audio source.

The audio amplifier includes further, optional components and at least one output amplification stage which is suited and/or designed to amplify an intermediate signal into the output signal. The intermediate signal is designed, in particular, as a signal that is generated on the basis of the input signal.

The output amplification stage is designed as an amplifier that is operated in the switched mode, in particular as an amplifier that amplifies a pulse-width modulated signal that is generated on the basis of the input signal and/or the intermediate signal, or that represents the intermediate signal.

Within the scope of the invention it is provided that a limiter device is integrated in the audio amplifier, which is programmed and/or electronically configured to generate the intermediate signal on the basis of the input signal, wherein the level of the intermediate signal always lies below a maximum level as a function of an adjustable maximum output and a load impedance which is coupled or can be coupled to the audio amplifier, or—alternatively—as a function of equivalent parameter limits such that the output signal does not exceed the maximum output at this load impedance, or the equivalent parameter limits, independently of the input signal. The limiter device preferably limits the intermediate signal only when this would cause the power, which is created by the output voltage, to exceed the output power that was set or programmed.

One idea of the invention is to provide an audio amplifier that can be adapted flexibly to different load impedances. The output power of an audio amplifier that can be attained in practical applications is typically decisively dependent on three factors: The internal operating voltage $U_0$ of the output amplification stage, the maximum current carrying capacity $I_P$, of the output amplification stage, and on the impedance of the load (e.g. the impedance of the loudspeaker) $R_{LSP}$.

The maximum output power of a conventional audio amplifier is achieved at the lowest impedance $R_{LSP}$ at which the end stage operates at the limit of the current carrying capacity $I_P$. Conversely, however, this means that the end stage cannot be fully utilized at higher impedances in terms of output power. The amplifier, in particular the power supply unit of the amplifier, is oversized in this case. To circumvent this disadvantage, different amplifier models having discretely graduated output power are typically offered.

In contrast, the audio amplifier according to the invention is designed such that it can provide a maximum and/or desired and/or specifiable output power—which are also referred to collectively in the following as maximum output power—within wide power ranges given any load impedance. The present invention therefore makes it possible to build audio amplifiers that can be varied within wide ranges in terms of output power, in particular the maximum output power. It is not necessary to switch the internal supply voltage, for instance, which simplifies the design of the amplifier. The invention is not limited to certain discrete output powers; preferably the output power can be adjusted steplessly.

Advantages of the invention that can be used as options are:

The maximum attainable output power of the amplifier can be provided within wide ranges at any desired load impedance;

The output power of the amplifier can be selected freely within wide ranges at a specifiable load impedance. As a result, it is often no longer necessary to stockpile amplifiers of different output classes since the amplifier can be adapted flexibly to the particular application.

According to one possible embodiment of the invention for multi-way systems (e.g. amplifier modules for active boxes), the output power for various paths can be varied in any manner nearly independently of one another without having to provide different operating voltages for the individual amplifier channels. For example, it often makes sense to select a lower power for the center frequency and treble ranges than for the low frequency path since this corresponds to the typical power distribution across the frequency of voice and music signals, and since the electrical loadability of bass loudspeakers is typically higher than that of center frequency and treble loudspeakers;

According to one possible embodiment of the invention as a multiple-channel amplifier, each channel can be set to any different output power at a load impedance that can vary within wide ranges. In practical application, the power provided by the power supply forms an upper limit for the total power of all channels;

To protect the connected loudspeakers against overload, the limiter device can be used—temporarily or permanently—to reduce or set the output power at any level;

For amplifiers according to the present invention, the need to use external limiters to limit the output power of the audio amplifier can be optionally omitted since this function is performed by the limiter device.

According to a highly practical embodiment of the invention, the limiter device is designed to limit the level of the intermediate signal below the maximum level as a function of an adjustable maximum output and a load impedance which is coupled or can be coupled to the audio amplifier. However, since the output voltage of output amplification stage $U_{out}$, output power $P_{out}$ and load impedance $R_{LSP}$ are related by the formula $$U_{out} = \sqrt{P_{out} \cdot R_{LSP}}$$

the input parameters of output voltage and load impedance, or output voltage and output power can be used as an alternative.

According to a preferred development of the invention, a control unit is provided which is designed to acquire values for the maximum output, in particular the desired and/or possible maximum output and/or the load impedance and/or the maximum output voltage. The values are entered into the control unit using a transfer device which, according to one alternative, permits the required values to be entered manually. The values can be entered e.g. as analog or digital values. According to one possible embodiment of the invention, the transfer device is designed to automatically determine the load impedance present at the audio amplifier and/or the output power and/or the output voltage. The automatically determined values can be transferred to the control unit instead of and/or in addition to the manually entered values, and can be used to control the limiter device.

According to a preferred embodiment, the output amplification stage is supplied with only a single bipolar voltage supply and/or is designed as a class-D amplifier and/or with constant amplification. This preferred embodiment underscores the advantage of the invention, namely that of providing an audio amplifier that includes cost-effective circuitry. Designing the output amplification stage as a class-D amplifier and/or with constant amplification is based on the fact that amplifiers of that type deliver consistently high efficiency across wide ranges of the input level of the intermediate signal.

According to a development of the invention, the limiter device comprises an analyzer unit and a limiter unit, wherein the analyzer unit outputs and/or feeds back a limiter signal to the limiter unit on the basis of an audio carrier signal that is present and the maximum level. The audio carrier signal can be designed as the input signal, or as a signal that has already been processed further. The analyzer unit and the limiter unit form a control loop, the control being designed such that the intermediate signal does not exceed the maximum level in the small-signal range.

The limiter unit can be designed as a preamplification device, the amplification of which is adjusted as a function of the limiter signal that is fed back, and/or as a damping device that dampens the audio carrier signal that is present on the limiter signal that is fed back. Optionally, the analyzer unit can likewise be designed as a limiter module, thereby enabling the limiter device to perform limitation in two stages; in the first stage—in the limiter unit—amplification is controlled or regulated and, in the second stage—in the analyzer unit—damping is controlled or regulated.

According to one possible embodiment, the limiter device is connected upstream of the output amplification stage and analyzes or limits the analog audio carrier signal, thereby forming the intermediate signal. According to an alternative embodiment of the invention, the limiter device is integrated in terms of circuit design such that the audio carrier signal is pulse-width modulated, and then the pulse-width modulated audio carrier signal is limited, thereby forming the intermediate signal.

According to a development of the invention, the audio amplifier includes an input amplification device that is designed to condition the input signal, in particular to adjust the input impedance and the input level. Optionally, the audio amplifier also includes a level-adjusting device for adjusting the volume and/or the amplification. The level-adjusting device is preferably connected such that it acts on the audio carrier signal in the small-signal range.

Although the present invention was described only on the basis of an output amplification stage and a limiter device, it lies within the scope of the invention for the audio amplifier to comprise a plurality of channels, each of which includes an output amplification stage that are assigned to one or more limiter devices, wherein the limiter devices can implement the limitation using different maximum levels. Using a multiple-channel audio amplifier of that type, it is possible to implement a mixed operation between loudspeaker configurations with different load impedances and, in this manner, on the basis of a single audio amplifier design, to selectively apply a maximum output power and/or a selected maximum output power to different load impedances. To perform a reconfiguration, it is only necessary to change the load impedance or the maximum output power or the equivalent limiting parameter.

A further subject matter of the invention relates to a method for reconfiguring an audio amplifier, preferably according to one of the preceding claims, which is characterized by the following steps: Disconnect a first loudspeaker system having a first load impedance from the audio amplifier, switch the maximum output power of the audio amplifier from a first value to a second value and, optionally, the load impedance, connect a second loudspeaker system having a second load impedance, wherein the first and the second load impedance are different.

BRIEF DESCRIPTION OF THE DRAWINGS

Further features, advantages, and effects of the invention result from the description that follows of a preferred embodiment of the invention, and from the attached figures. They show.

EMBODIMENT(S) OF THE INVENTION

Figure 1:
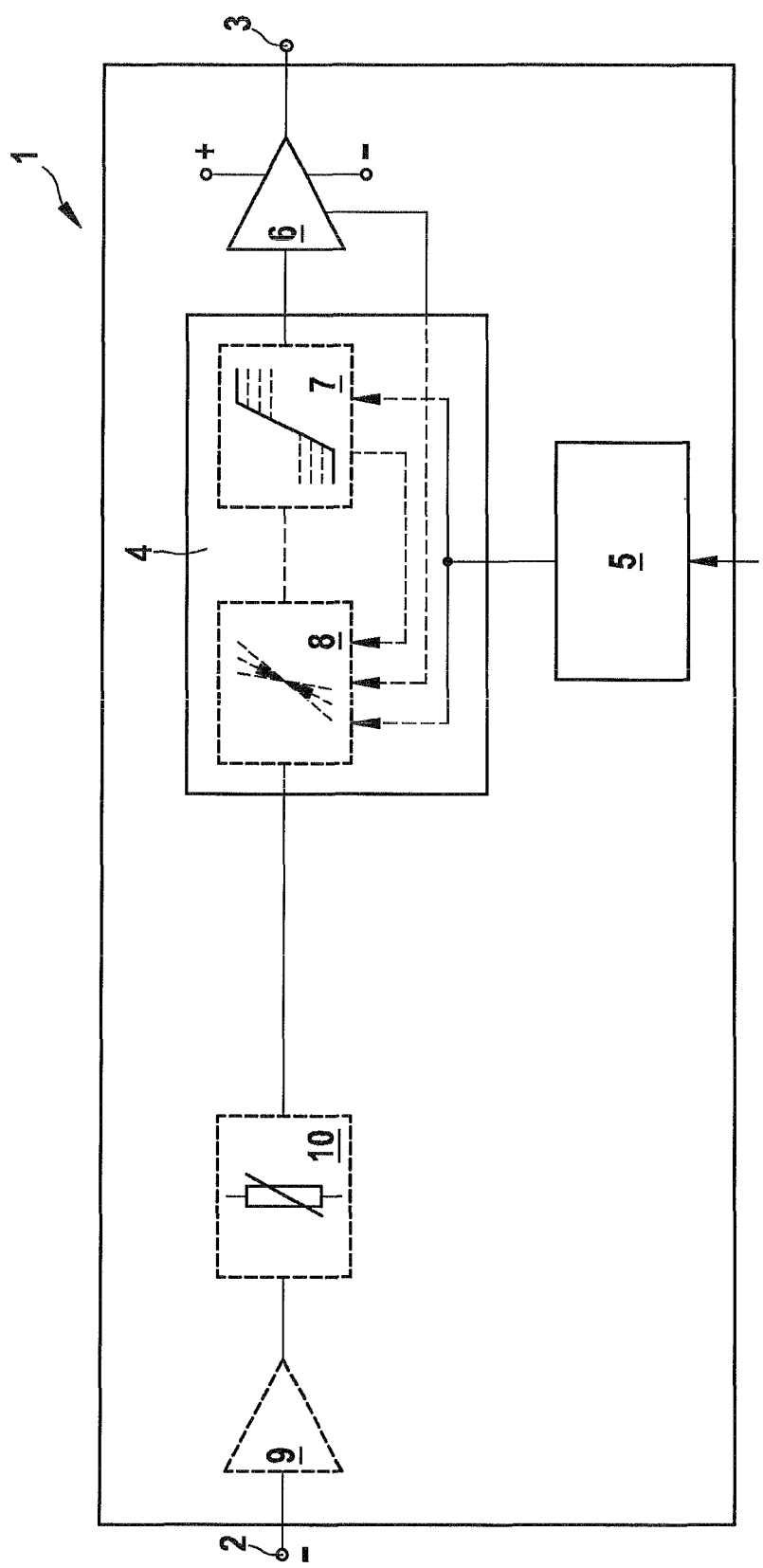
FIG. 1 a block diagram of an audio amplifier according to the invention.

FIG. 1 shows, in a schematic block diagram, an audio amplifier 1 which is designed to amplify an input signal present at an input interface 2 into an output signal present at an output interface 3. Audio amplifiers 1 of that type are used e.g. in acoustic irradiation systems (e.g. public address systems) or in music amplifiers. Audio amplifier 1 is designed such that, at output interface 3, an output signal for loudspeaker systems (not depicted) having various load impedances can be output with an adjustable maximum output. To perform the adjustment, the load impedance and the desired maximum output are selected manually and/or detected automatically. Instead of the parameter set of load impedance and maximum output, an equivalent parameter set can be used. On the basis of the parameter set, audio amplifier 1 is driven in a manner such that the maximum output is not exceeded at the corresponding load impedance.

In the block diagram, the most important components are depicted using a solid line, and the optional components of audio amplifier 1 are depicted using dashed lines. Starting at input interface 2, the input signal is routed, optionally using further functional modules—also referred to as an audio carrier signal in the original state or in the processed state—to a limiter device 4 which limits the audio carrier signal above or at a maximum level as a function of a control signal of a control unit 5, and is forwarded as a limited intermediate signal to an output amplification stage 6.

An idea behind audio amplifier 1 is that the maximum output voltage at output interface 3 is not determined by the level of an internal voltage supply of audio amplifier 1, but by the limitation of the intermediate signal in the small-signal range. The supply voltage is selected such that output amplifier stage 6 can output the desired maximum output power at the highest desired load impedance. If the aim is to design audio amplifier 1 e.g. to output 1000 watts at a low impedance of 8 ohms, the effective supply voltage must be 126.5 V, although a slightly higher voltage is required in practical applications due to voltage drops at actual components. If the aim is for audio amplifier 1 to output the same output power at a lower load impedance and/or an output power that is less than the maximum output, then it is not necessary in the case of present audio amplifier 1 to vary the level of the internal supply voltage; instead, the limitation of the output voltage and, therefore, the output power is achieved by limiting the intermediate signal in the small-signal range using limiter device 4. The clip limit in limiter device 4 is selected such that the maximum output voltage that can thus be achieved at output interface 3 is appropriate for the selected configuration of output power—load impedance. The control signal of control unit 5 for limiter device 4 can be designed as a setpoint value for a maximum level of the intermediate signal or as the parameter for determining the maximum level.

Output amplification stage 6 is designed as a class-D amplifier. The class-D amplifier operates in a switched mode, wherein the theoretical power efficiency is 100%, and the practical efficiency is 90% due to losses from switching and conduction. In an embodiment presented as an example, a class-D amplifier can be subdivided into three regions, the first region comprising an input for the intermediate signal, a triangular signal generator and a comparator, the second region comprising a switch amplification stage, and the third region comprising a low-pass filter.

In the first region, the preferably triangular-wave signal, which is generated by the signal generator, is modulated by the intermediate signal, wherein the comparator compares the voltage values of the intermediate signal with that of the signal from the signal generator and then switches its output on or off depending on which of the two signals has the higher voltage at that moment. The first region is therefore a pulse-width modulation (PWM) which provides, as the output signal, a square-wave signal having the same frequency as the signal of the signal generator, but having rectangles—the pulse widths—of different widths. The latter depict the information via the amplitude and frequency of the audio signal. In the second region, the PWM signal is amplified e.g. using transistors, the transistors being fully enabled or fully disabled, and therefore being on or off, which is also the reason for the high efficiency of this circuit design. In the third region, the carrier signal generated by the signal generator is filtered out, for which a passive LC filter is typically used. Due to internal design and the independence of the efficiency of the modulation, the class-D amplifier can also be operated in a starting voltage range that represents only a fraction of the actual operating voltage that is available. It should be noted that the present invention is not limited to a certain topology of a class-D amplifier and, in particular, is not bound to a certain modulation or feedback scheme of the class-D amplifier.

Due to limiter device 4 which can be adjusted or driven using control unit 5, the audio carrier signal is limited symmetrically, and therefore a intermediate signal which has been limited to a maximum level is present at downstream output amplification stage 6.

Since the downstream class-D amplifier has constant amplification and always operates in the linear range due to the selected level of the supply voltage, entire audio amplifier 1 behaves, as viewed from the outside, like a conventional amplifier, where the internal voltage supply can be adjusted virtually steplessly.

In one possible embodiment, limiter device 4 can be composed of an analyzer unit 7 and a limiter unit 8, as depicted in FIG. 1. In terms of function, analyzer unit 7 analyzes the audio carrier signal that is present and outputs a limiting signal to limiter unit 8, thereby enabling it to amplify or dampen the audio carrier signal. Optionally, analyzer unit 7 also limits the duty cycle of the audio carrier signal.

Figure 2:
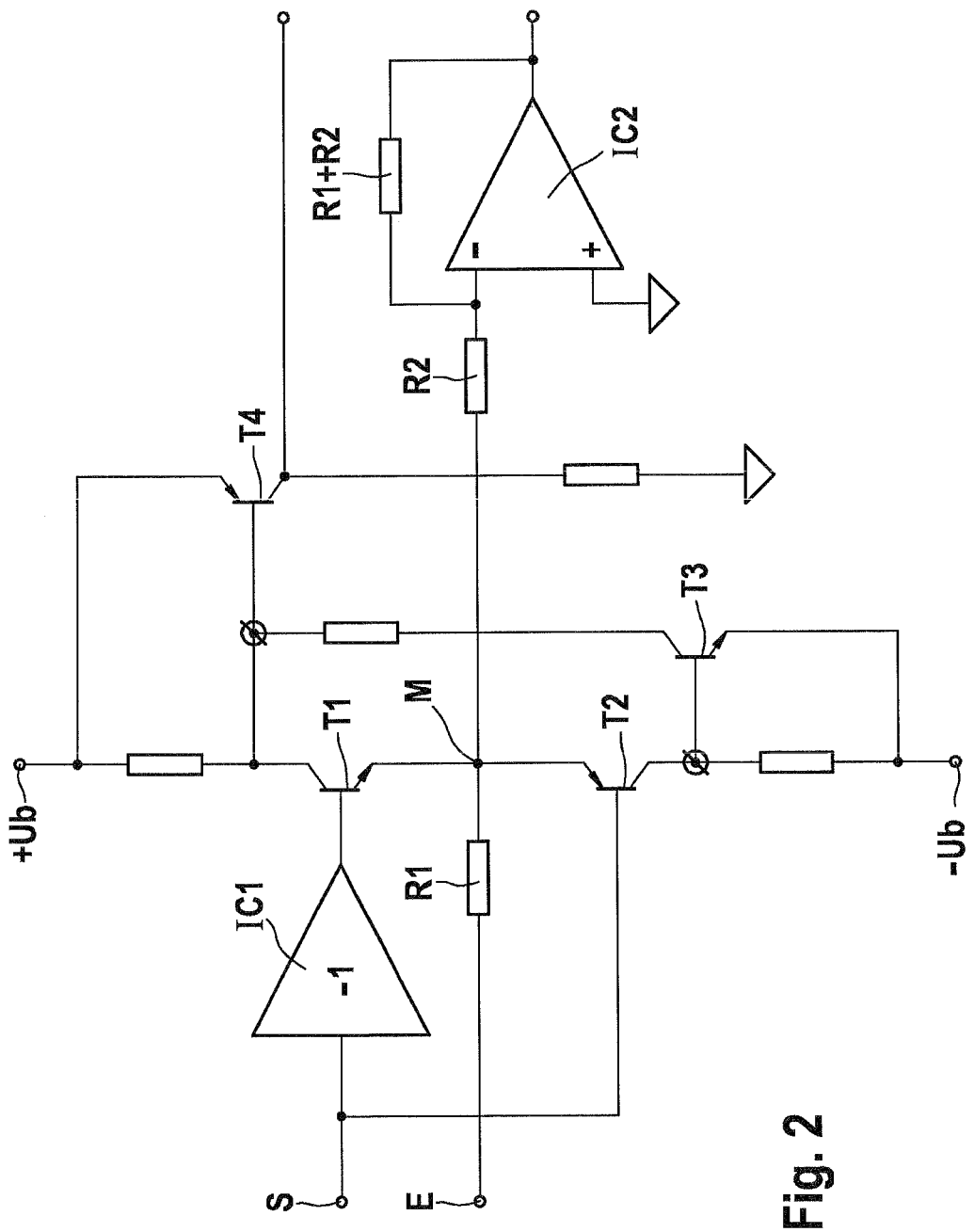
FIG. 2 a block diagram of the analyzer unit in the audio amplifier depicted in FIG. 1.

One possible embodiment of analyzer unit 7 is depicted in FIG. 2 in a schematic wiring diagram. The audio carrier signal is supplied to analyzer unit 7 at an input E via a resistor R 1. Resistor R 1, in combination with a resistor R 2, forms a voltage divider. Common center point M of this voltage divider is simultaneously connected, as a node, to the emitters of transistors T1 and T2, wherein transistors T1 and T2 limit the signal. When they are in the cut-off state, the current of the audio carrier signal flows through resistor R 1 to a negative input of an operational amplifier IC2 which is connected to virtual ground. Since operational amplifier IC2 is fed back to R1 plus R2, the amplification of the limiter is zero dB. The application of limiter device 4 is specified by a positive control voltage from control unit 5, which is present at input S. To achieve symmetrical signal limitation, control signal S is inverted using an operational amplifier IC1. The inverted control signal is supplied to the base of T1, and the non-inverted control signal is supplied to the base of T2. If the audio carrier signal exceeds the control voltage by the base-middle forward voltage at the center point of voltage divider R1 and R2, then T2 becomes conductive. As a result, T2 clips the input level in the positive voltage range at the level of the control voltage plus one diode region. In the same manner, T1 clips the input signal in the negative voltage range. In this manner, the selection of the control voltage results in a symmetrical signal limitation of the control signal of downstream output amplification stage 6. Transistors T3 and T4 are required only when limiter unit 8 is present. Transistors T3 and T4 provide a trigger signal when signal limitation is used in analyzer unit 7 of limiter unit 8. This trigger signal is 0 volts in the rest state; when signal limitation is used, it increases to positive UB since T4 becomes conductive. Due to this control loop, hard clipping of the audio signal in limiter device 4 does not occur; instead, upstream limiter unit 8 reduces the amplification accordingly until the application limit of the limitation has just been reached by analyzer unit 7.

As an option, audio amplifier 1 includes the following components as further functional blocks: An input amplification device 9 adapts the input signal in terms of impedance and level to the downstream stages of audio amplifier 1. For an amplifier according to the present invention, it is inconsequential whether the input amplifier was designed for symmetrical or asymmetrical input signals. A level adjuster 10 is used to adjust the volume and amplification. Level adjustor 10 is not absolutely necessary for the function of audio amplifier 1, and optionally can be omitted. As an optional additional function, limiter unit 8 ensures that the distortions of the output signal do not exceed a certain percentage (e.g. 1%) under any circumstances. If audio amplifier 1 had to leave its linear region, e.g. if the limit of the operating voltage was reached or if limited by analyzer unit 7, then limiter device 8 reduces the amplification until the distortions of the output signal remain limited. According to an alternative operating mode, it can also make sense for control unit 5 to adjust the amplification of entire audio amplifier 1 in limiter unit 8.

In terms of the design of audio amplifier 1, control unit 5 can be a discrete component, or it can be realized as an integrated circuit such as a microcontroller circuit. It is also feasible for control unit 5 to be installed in an external device and to transfer the drive signals for limiter device 4 in a wired or wireless manner.

What is claimed is:

1. An audio amplifier (1) for amplifying an input signal into an output signal, comprising:
    an output amplification stage (6) for amplifying an intermediate signal into the output signal that is designed to operate in a switched mode,
    a control unit (5),
    a transfer device designed for the manual input of a load impedance and at least one of a maximum output power and a maximum output voltage present at the audio amplifier (1) and, for transfer to the control unit (5), and
    a limiter device (4) programmed or electronically configured to generate the intermediate signal from the input signal and to limit a maximum level of the intermediate signal as a function of the maximum output power and the load impedance which is coupled or can be coupled to the audio amplifier, or as a function of the maximum output voltage and the load impedance without reliance upon the input signal,
    wherein the control unit is designed to drive the limiter device (4).

2. The audio amplifier (1) according to claim 1, characterized in that the equivalent parameter limits are designed as the parameter set output voltage, load impedance or output power.

3. The audio amplifier (1) according to claim 1, wherein the control unit (5) is designed to acquire values for the at least one of the maximum output, the load impedance and the maximum output voltage to drive the limiter device (4).

4. The audio amplifier (1) according to claim 1, characterized in that the output amplification stage (6) is supplied by a single bipolar voltage supply or, the output amplification stage is designed as a class-D amplifier, with or without constant amplification or, the output amplification stage (6) is supplied by a single bipolar voltage supply or, the output amplification stage is designed as a class-D amplifier, with or without.

5. The audio amplifier (1) according to claim 4, characterized in that the limiter unit (7) is designed as at least one of a preamplification device and a damping device.

6. The audio amplifier (1) according to claim 1, characterized in that the limiter device (4) comprises an analyzer unit (7) and a limiter unit (8), wherein the analyzer unit (7) at least one of outputs and feeds back a limiting signal to the limiter unit (8) on the basis of an audio carrier signal that is present.

7. The audio amplifier (1) according to claim 1, characterized by an input amplifier device (9) for conditioning the input signal.

8. The audio amplifier (1) according to claim 1, characterized by a level adjusting device (10) for adjusting at least one of the loudness level and the amplification of the audio amplifier (1).

9. The audio amplifier (1) according to claim 1, characterized by a plurality of channels, wherein each channel includes an output amplification stage (6) and an assigned limiter device (4).

10. A method for reconfiguring an audio amplifier (1) according to claim 1, which is characterized by the following steps:
    disconnect a first loudspeaker system having a first load impedance from the audio amplifier (1);
    reconfigure the maximum power output of the audio amplifier (1) from a first value to a second value, and from the first load impedance to a second load impedance; and
    connect a second loudspeaker system having the second load impedance, wherein the first and the second load impedances are of different designs.

11. The audio amplifier (1) according to claim 1, wherein the maximum output power is an allowable maximum output power.

12. An audio amplifier for amplifying an input signal into an output signal, comprising:
    an output amplification stage for amplifying an intermediate signal into the output signal that is designed to operate in a switched mode,
    a control unit,
    a transfer device designed for the manual input of a maximum output power of the output signal and a load impedance and, for transfer to the control unit, and
    a limiter device programmed or electronically configured to generate the intermediate signal from the input signal and limit a maximum level of the intermediate signal as a function of the maximum output power and the load impedance, without reliance upon the input signal, wherein the control unit is designed to drive the limiter device.

13. The audio amplifier (1) according to claim 12, wherein the maximum output power is an allowable maximum output power.

* * * * *